United States Patent
Knapp et al.

(10) Patent No.: US 8,642,139 B2
(45) Date of Patent: Feb. 4, 2014

(54) PROCESS TO MAKE STRUCTURED PARTICLES

(75) Inventors: Angela Michelle Knapp, Ann Arbor, MI (US); Monique N. Richard, Ann Arbor, MI (US); Claudia Luhrs, Rio Rancho, NM (US); Timothy Blada, Albuquerque, NM (US); Jonathan Phillips, Rio Rancho, NM (US)

(73) Assignees: Toyota Motor Engineering & Manufacturing North America, Inc., Erlanger, KY (US); STC.UNM, Albuquerque, NM (US)

(*) Notice: Subject to any disclaimer, the term of this patent is extended or adjusted under 35 U.S.C. 154(b) by 1192 days.

(21) Appl. No.: 12/480,812

(22) Filed: Jun. 9, 2009

(65) Prior Publication Data

US 2010/0310784 A1    Dec. 9, 2010

(51) Int. Cl.
  *B05D 1/08* (2006.01)
  *H05H 1/24* (2006.01)
  *B32B 27/32* (2006.01)

(52) U.S. Cl.
  USPC ............ 427/569; 427/446; 427/904; 428/220

(58) Field of Classification Search
  USPC .................... 427/569, 904; 428/220
  See application file for complete search history.

(56) References Cited

U.S. PATENT DOCUMENTS

| | | | |
|---|---|---|---|
| 5,169,558 A | 12/1992 | Smrt et al. | |
| 5,260,105 A | 11/1993 | Wang | |
| 5,366,770 A | 11/1994 | Wang | |
| 5,989,648 A | 11/1999 | Phillips | |
| 6,024,915 A * | 2/2000 | Kume et al. | 419/48 |
| 6,780,350 B1 | 8/2004 | Kodas et al. | |
| 7,083,747 B2 | 8/2006 | Hampden-Smith et al. | |
| 2001/0046628 A1* | 11/2001 | Oesten et al. | 429/231.1 |
| 2005/0211685 A1* | 9/2005 | Blankenship | 219/130.4 |
| 2008/0145553 A1* | 6/2008 | Boulos et al. | 427/447 |

FOREIGN PATENT DOCUMENTS

KR    2006027136    *  3/2006  ........... B22F 1/02

OTHER PUBLICATIONS

English Translation of KR2006027136, pp. 1-29.*
Oxford dictionary "Powder" <http://oxforddictionaries.com/definition/english/powder?q=powder> Accessed Feb. 20, 2013.*

* cited by examiner

*Primary Examiner* — Timothy Meeks
*Assistant Examiner* — Mandy Louie
(74) *Attorney, Agent, or Firm* — Gifford, Krass, Sprinkle, Anderson & Citkowski, P.C.

(57) ABSTRACT

Disclosed is a process for making a composite material that contains structured particles. The process includes providing a first precursor in the form of a dry precursor powder, a precursor liquid, a precursor vapor of a liquid and/or a precursor gas. The process also includes providing a plasma that has a high field zone and passing the first precursor through the high field zone of the plasma. As the first precursor passes through the high field zone of the plasma, at least part of the first precursor is decomposed. An aerosol having a second precursor is provided downstream of the high field zone of the plasma and the decomposed first material is allowed to condense onto the second precursor to from structured particles.

16 Claims, 5 Drawing Sheets

PROCESS TO MAKE STRUCTURED PARTICLES

GOVERNMENT INTEREST

This invention was made with government support under Contract No. DE-AC52-06NA25396 awarded by the U.S. Department of Energy. The government has certain rights in the invention.

FIELD OF THE INVENTION

The present invention relates to a process to make particles, in particular a process to make structured particles.

BACKGROUND OF THE INVENTION

The development and production of nanoparticles has been the focus of research efforts for at least the last ten years with the properties of nanoparticles often exhibiting behavior that bridges the gap between bulk materials and atomic or molecular structures. For example, nanoparticles can exhibit properties that are dependent on the size of particles and properties such as melting temperatures, thermal and/or electrical conductivity, physical hardness and the like can be vastly different when compared to bulk materials having the same chemical composition.

Methods used to produce metal nanoparticles include mechanical attrition, sputtering, pyrolysis of organometallic compounds, microwave plasma decomposition of organometallic compounds and the like. Plasma decomposition of dry precursor powders has proven to be an effective method for producing nanoparticles since dry precursor powders can simplify material handling concerns, a relatively tight range of particle size can be obtained and acceptable production rates are available. However, previous methods to produce core-shell structured nanoparticles have been limited to methods that suffer from large particle size distribution and low production rates. As such, a process for making structured particles, and in some instances structured nanoparticles, that does not suffer from prior art disadvantages would be desirable.

SUMMARY OF THE INVENTION

Disclosed is a process for making a composite material that contains structured particles. The process includes providing a first precursor that includes a first material and a plasma torch, the plasma torch operable to generate a plasma region. The first precursor, which can be in the form of a dry precursor powder, a precursor liquid, a precursor vapor of a liquid and/or a precursor gas is passed through a high field zone of a plasma generated by the plasma torch with at least part of the first precursor undergoing decomposition. If the first precursor includes a dry precursor powder, a precursor liquid and/or a precursor vapor of a liquid, it can be suspended in a first gas to produce a first aerosol before passing through the high field zone of the plasma. If the first precursor includes a precursor gas, then the precursor gas may or may not be mixed with a first gas before passing through the high field zone of the plasma.

A second aerosol having a second precursor in the form of a dry precursor powder can be suspended in a second aerosol gas and introduced after or downstream of the plasma generating zone. This arrangement ensures that the second aerosol does not travel through the high electric and/or magnetic field region (RF, microwave, DC, etc.) that generates the plasma. However, the second aerosol can be injected into an 'afterglow' region of the plasma. In some instances, the dry precursor powder of the second precursor contains particles to be at least partially coated by the first precursor after it has decomposed, and sometimes by atoms from the first aerosol gas and/or a plasma gas as well. In addition, the first precursor material can include a shell material and the second precursor can include a core material and the structured particles can be structured nanoparticles.

DETAILED DESCRIPTION OF THE INVENTION

The present invention includes a process for making a composite material that contains structured particles. The structured particles can be used as an electroactive material, a catalyst material, a hydrogen storage material and the like. As such, the present invention has utility as a process for making a material.

The process includes providing a first precursor in the form of a dry precursor powder, a precursor liquid, a precursor vapor of a liquid and/or a precursor gas that includes a first material. It is appreciated that the first material can be a precursor for a shell or coating material for the structured particles. The dry precursor powder and/or precursor liquid can be suspended in a first gas to produce a first aerosol containing the first precursor. If the first precursor includes a precursor vapor of a liquid and/or a precursor gas, then the precursor vapor and/or precursor gas may or may not be mixed with the first gas prior to entering the plasma torch. For the purposes of the present invention, an aerosol is defined as a gaseous suspension of fine solid particles and/or liquid drops.

The process also includes providing a plasma having a high field (electric and/or magnetic) zone that generates a plasma from gas or liquid inflows. The high field zone is a region of high electromagnetic energy that can be generated using radio frequency, microwave energy or direct current discharge. The first precursor can be passed through the high field zone of the plasma, with decomposition of at least part of the first material occurring. If the first precursor includes dry precursor powder and/or liquid, the decomposition can include vaporization of the first material. However, if the first precursor includes the precursor vapor of a liquid and/or the precursor gas, then the decomposition can include the decomposition of molecules of the precursor vapor and/or precursor gas into smaller molecules and/or atoms.

Downstream from the high field zone a second aerosol having a second precursor suspended in a second aerosol gas is introduced. This arrangement insures that the second aerosol does not travel through the high electric and/or magnetic field region (RF, microwave, DC, etc.) that generates the plasma. However, the second aerosol can be injected into an 'afterglow' region of the plasma, a region of the plasma torch immediately adjacent to the high field zone, i.e. there is no other region between the high field zone and the afterglow region. The afterglow region, although absent a field high enough to generate a plasma from a gas or liquid, can have an elevated temperature (>100° C.) and can contain, in addition to gas, high energy charged species, chemical radicals, liquids and solids. It is appreciated that the afterglow region can in fact be best classified as a plasma region by virtue of containing free electrons and ions, as well as chemical radical species. These plasma species (e.g. high energy charged species) primarily enter the afterglow region from the high field region via flow or diffusion, however, some radicals, ions and electrons can still be generated in the afterglow region from the high energy charged species.

The second precursor can be in the form of a dry precursor powder that includes a second material. In some instances, the second material includes particles to be at least partially coated by the first material from the first precursor after it has been decomposed, and sometimes by atoms from the first aerosol gas and/or plasma gas as well. In this manner, the second material in the form of particles that have been prepared previously with desired structure, shape, size and/or properties can be at least partially coated by a variety of materials to make novel structured particles. For the purposes of the present invention, the term "structured particles" is defined as particles that have a desired manufactured shape, size, mixture of materials, size and/or configuration of mixture of materials.

For example and for illustrative purposes only, a core-shell particle having an inner core encapsulated by an outer shell is an example of a structured particle, as is a core-shell particle having one or more additional outer shells/coatings. In the alternative, a particle having a first material core with a second material attached to the core at discrete locations on the surface of the core—such that a desired first material/second material physical configuration is obtained—is an example of a structured particle.

As noted above, the structured particles can have an inner core of the second material enclosed within an outer shell of the first material or a core of the second material partially coated with the first material. In addition, a structured particle produced using the process disclosed herein can be used as a precursor in a subsequent particle making process. For example, a core-shell particle produced as disclosed herein can be used as a second precursor with an additional one or more layers of coating applied thereto. The additional one or more layers can consist of the original second material, a mixture of the original second material with a new third material, a new third material, fourth material, combinations thereof and the like.

It is appreciated that the same is true for structured particles that are not core-shell particles, i.e. a variety of structured particles can be "designed" and manufactured by depositing a precursor material that has passed through the high field zone of the plasma onto a different precursor material—which may or may not already be a structured particle—that has been entered into the plasma downstream of the high field zone. Such structured particles can be catalytic particles where the first and/or second material is a support for the second and/or first material, respectively, which is a catalyst. As such, the process disclosed herein can provide particles with a generally limitless array of material and physical configuration choices so long as the first precursor passes through the high field zone and the second precursor bypasses the high field zone in order to produce the structured particles.

The particles can be micron-sized particles, submicron-sized particles and/or nanometer sized particles. For the purposes of the present invention, micron-sized particles are particles having a mean diameter of between one and one thousand microns, submicron-sized particles are particles having a mean diameter of between two hundred and one thousand nanometers, and nanometer sized particles, also known as nanoparticles, having a mean diameter of between one and two hundred nanometers.

In some instances, new particles can be created in the high field zone by the reorganization of atoms from the first precursor, and sometimes atoms from the first gas and/or plasma gas as well. Thereafter, the first gas can carry any new particles out of the high field zone and into a plasma afterglow region. The afterglow region is a volume of space downstream from the high field zone. This region, although absent a field high enough to generate a plasma from a gas or liquid, can have an elevated temperature (>100° C.), and the state of matter still classified as a plasma (i.e. contains free electrons and ions). It must be noted that in the absence of a high field, all species rapidly cool in the afterglow region. In addition, the rapid cooling leads to the transformation of the plasma to a non-plasma, that is a mixture of gas, liquid and/or solid, and can impact the new particle structure. Upon exiting the afterglow region, the particles are received into a zone having near ambient temperature where the highly transformed particles created in the high field zone and afterglow region from the atomic constituents of the first precursor, and in some gases the plasma carrier gas and/or the first gas, can be removed from the system, typically with a filter.

In other instances, new particles can be created downstream of the high field zone by material from the second precursor being coated by material from the first precursor. For example, the material from the second precursor can optionally include particles that are desired to be at least partially coated by the first material, with the second precursor particles at least partially coated by the deposition of atoms from the decomposed first precursor.

The plasma can be a non-oxidizing plasma and in some instances is a low power atmospheric or near-atmospheric pressure plasma with the plasma generated by focusing microwave energy within a coupler. The first gas and the second gas can be an inert gas, illustratively including helium, argon and combinations thereof. In addition, the first gas can be an active gas, i.e. a gas that contains at least part of the first precursor, for example Ar+ethylene and the like.

The process can further include passing a plasma gas in addition to the first gas through the high field zone of the plasma, the plasma gas also being an inert gas. In some instances, the second material is a lithium alloying material, i.e. a material that can alloy with lithium, and can contain an element such as tin, silicon, aluminum, titanium, germanium, combinations thereof and the like. In other instances, the second material is a lithium compound. The first material can contain an element selected from carbon, nitrogen, oxygen, combinations thereof and the like, illustratively including carbon, carbides, nitrides, oxides, etc. It is appreciated that the process also affords for the forming of structured particles that have a multilayered core and/or a multilayered coating with the core and/or coating being made from first precursor and/or second precursor material.

At least one embodiment of the present invention provides a process for producing structured particles that have an outer mean diameter of less than one thousand microns. In some instances, the structured particles with an outer mean diameter less than one thousand nanometers can be produced, while in other instances structured particles with an outer mean diameter of less than 500 nanometers can be produced. In still other instances, structured particles with an outer mean diameter less than 200 nanometers can be produced, while in still yet other instances particles with an outer mean diameter less than 100 nanometers can be produced. In even still other instances, structured particles with an outer mean diameter less than 50 nanometers are produced. The average wall thickness of an outer shell for core-shell structured nanoparticles can be less than 1 micron, can be less than 500 nanometers, can be less than 100 nanometers, can be less than 50 nanometers, and in some instances can be less than 20 nanometers.

Figures 1, 2A:
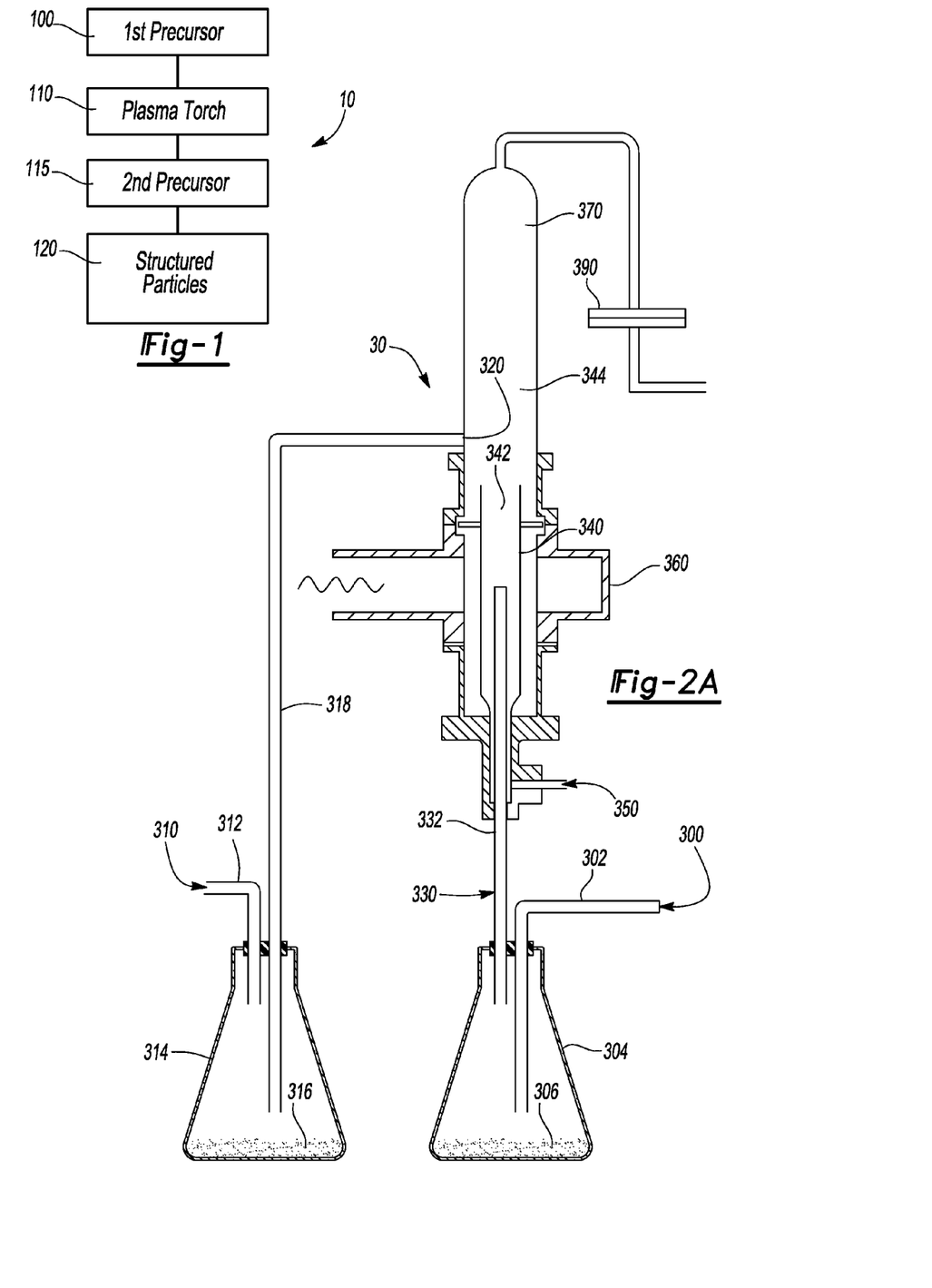
FIG. 1 is a flow diagram illustrating a method for producing structured particles.
FIG. 2A is a schematic representation of an apparatus used to make structured particles using a dry precursor powder.

Turning now to the figures wherein like numerals correspond to like elements throughout, FIG. 1 illustrates an embodiment for producing a composite material containing structured particles at reference numeral 10. The process 10 includes providing a first precursor in the form of a powder, a liquid, a vapor of a liquid and/or a gas at step 100 and passing the first precursor through a plasma torch at step 110. Upon passing the first precursor through the plasma torch at step 110, decomposition of at least part of a first material included as part of the first precursor occurs. In some instances, the first precursor can include a plurality of materials, e.g. the first material plus one or more additional materials. In addition, a second precursor containing a second material in the form of a dry precursor powder can be provided at step 115. Vapor containing material from the first precursor that has been decomposed is then allowed to deposit onto the second material from the second precursor to form structured particles at step 120.

Turning now to FIG. 2A, a schematic representation of an apparatus for producing structured particles using a dry precursor powder is shown generally at reference numeral 30. As shown in this figure, a first gas 300 passes through an inlet tube 302 into a first precursor container 304 that contains a first precursor 306. The first precursor 306 can contain one or more materials, for example, a dry precursor powder. The first precursor 306 can also contain elements that are not incorporated within the structured particles that are produced, but may be present to assist in the overall process in some manner.

Flow of the first gas 300 into the first precursor container 304 at a sufficient flow rate can result in the suspension of the first precursor 306 to produce a first aerosol, with the first precursor passing or flowing through the exit tube 330 with at least part of the exit tube 330 passing into a quartz plasma torch 340. In some instances, the exit tube 330 has a ceramic portion 332 that terminates generally in the middle of a waveguide 360. The waveguide 360 is used to couple microwave energy to the plasma torch 340. Also included can be a plasma gas 350 which passes within the plasma torch 340, but exterior to the ceramic portion 332 of the exit tube 330 which has the first aerosol passing therethrough.

Upon focusing microwave energy with the waveguide 360 onto the plasma torch 340, a plasma can be generated with a high field zone 342 located within the plasma torch 340. As the first aerosol passes through the high field zone 342 of the plasma torch 340, the temperature of the high field zone 342 is such that decomposition of at least part of the first precursor 306 occurs. The decomposed first precursor 306 exits the high field zone 342 of the plasma torch 340 and enters into a chimney region 370. Upon exiting the high field zone 342, the atoms of the decomposed first precursor 306 can condense into solid form.

A second gas 310 can be provided and pass through an inlet tube 312 into a second precursor container 314 that contains a second precursor 316. Flow of the second gas 310 into the second precursor container 314 at a sufficient flow rate results in the suspension of the second precursor 316 within the second gas 310 to produce a second aerosol. The second precursor 316 can contain one or more materials in the form of particles. Similar to the first precursor 306, the second precursor 316 can also contain elements that are not incorporated within the core and/or shell of any structure nanoparticles that are produced, but may be present to assist in the overall process in some manner.

After the second aerosol has been produced, it can pass or flow through an exit tube 318 and enter the apparatus 30 downstream from the high field zone 342 at location 320. In some instances, the second aerosol enters the apparatus 30 in an afterglow region 344. After entering the apparatus 30 at location 320, the second precursor can be coated when atoms of the decomposed first precursor condense into solid form thereon and thereby form structured particles. The structured particles can be collected from a particle filter 390, from the interior sidewalls of the chimney region 370 and/or from a particle trap (not shown).

A schematic illustration of an apparatus for producing structured particles using a precursor liquid is shown in FIG. 2B where like numerals refer to like components discussed above. In this embodiment, the first gas 300 can pass or bubble through a precursor liquid 303 held in a precursor liquid container 301 at a sufficient rate such that droplets of the liquid 303 are incorporated in the first gas to provide an aerosol. It is appreciated that vapor of the liquid 303 can also be present in the first gas 300 after it passes through the 303. In addition, the first gas 300 can optionally pass through a container 290 which can be used to prevent back diffusion of vapor from the liquid 303 to a source of the first gas 300.

After passing through the container 301, the first gas 300 with droplets and/or vapor of the liquid 303 can pass through the container 304 and into the plasma torch 340. It is appreciated that the container 304 may or may not contain the dry precursor powder 306 and the first gas 300 with droplets and/or vapor of the liquid 303 can pass or enter directly into the plasma torch 340 (not shown in FIG. 2B) without the use of the container 304.

Referring now to FIG. 2C, the first precursor can be provided as an active gas 305 that passes into the plasma torch 340. In some instances, the active gas 305 can be mixed with the first gas 300, however this is not required. In addition, the active gas 305 can pass through the container 304, which in some instances may or may not be void of a precursor material, or in the alternative pass directly into the plasma torch without the use of the container 304.

Figure 3A:
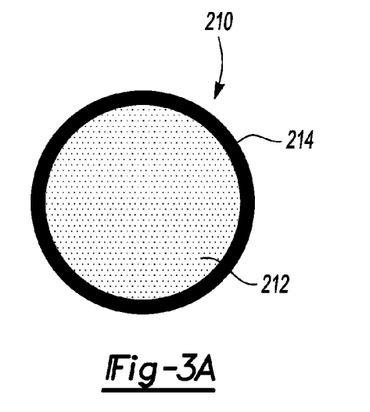
FIG. 3A is a schematic representation of a core-shell structured particle made according to an embodiment of the present invention.
Figure 3B:
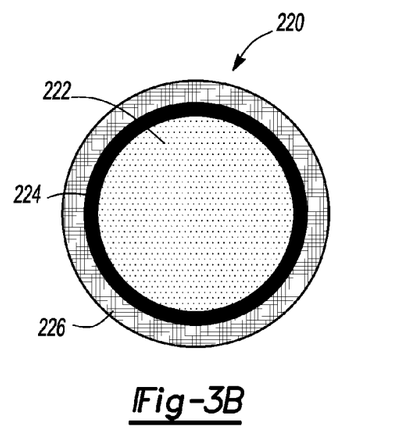
FIG. 3B is a schematic representation of a core-shell structured particle having an additional outer shell made according to an embodiment of the present invention.
Figure 3C:
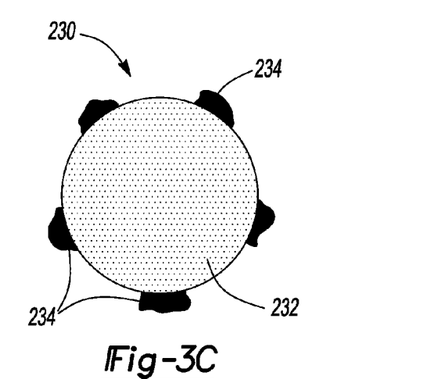
FIG. 3C is a schematic representation of a structured particle made according to an embodiment of the present invention.
Figure 3D:
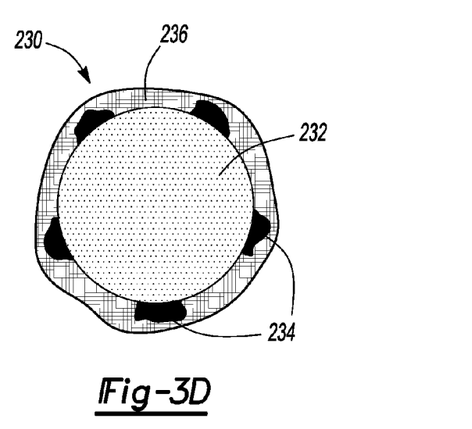
FIG. 3D is a schematic representation of a structured particle made according to an embodiment of the present invention.
Figure 3E:
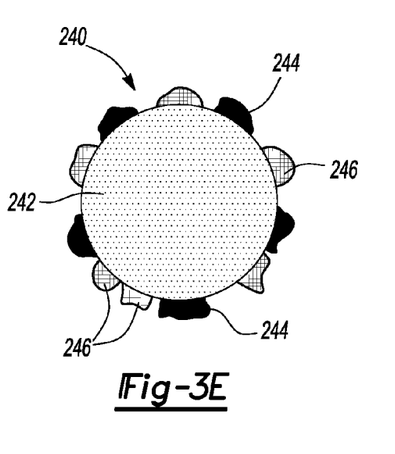
FIG. 3E is a schematic representation of a structured particle made according to an embodiment of the present invention.
Figure 3F:
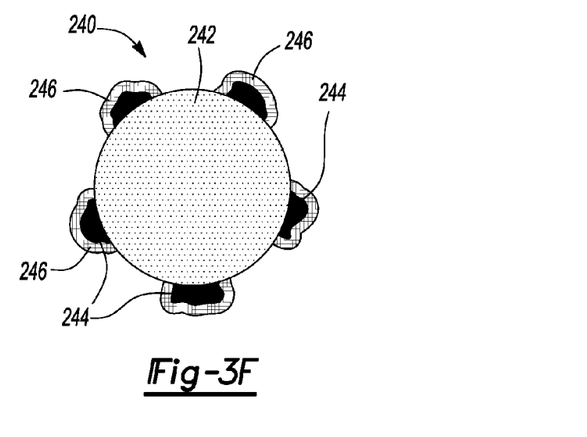
FIG. 3F is a schematic representation of a structured particle made according to an embodiment of the present invention.

FIGS. 3A-3F schematically illustrate structural particles that may be produced using the apparatus 30. For example, FIG. 3A illustrates a core-shell structured particle 210 having an inner core 212 made from the second material and an outer shell 214 made from the first material. FIG. 3B illustrates a core-shell 220 particle having an inner core 222 made from the second material, a first outer shell 224 made from a second material and a second outer shell 226 made from a third material. FIG. 3C illustrates a structured particle 230 having a core 232 made from a first material and a second material 234 attached to discrete locations of the core 232, whereas FIG. 3D illustrates the structured particle 230 having been coated to produce a shell 236 made from a third material. And finally, FIG. 3E illustrates a structured particle 240 that has a core 242 made from a first material and a second material 244 and a third material 246 attached at discrete locations of the core 242. It is appreciated that the second material 244 and third material 246 can have portions that may or may not overlap each other, or in the alternative, the third material 246 can encapsulate the second material 244 as shown in FIG. 3F without forming a complete outer shell as illustrated by the outer shell 236 in FIG. 3D.

Not being bound by theory, the mechanism for the formation of the structured particles is hypothesized to result from the condensation of atoms from decomposed first precursor material to form at least part of a core and/or coating via a nucleation process. The condensed first precursor material atoms collect on similar nuclei and at least partially coat and/or attach to the second precursor material. In the afterglow region 344 the structured particles are "frozen" into their final configuration, with the first material and the second material having their final configuration with respect to each other, size and the like. It is appreciated that the structured particles can be used as the second precursor material and at least partially coated again using the same process and thereby produce multilayered and/or gradient layered structured particles.

Various precursor powder materials can be used to produce structured particles. For example, a material capable of alloying with lithium can be used as the second material and compounds containing carbon, nitrogen, oxygen, phosphorus, sulfur and the like can be used as the first material. In the alternative, lithium compounds can be used as the second material. In some instances, second material particles that are in the second aerosol do not melt or vaporize after entering the apparatus 30 and are coated by condensing atoms of the first material exiting the high field zone 342.

In order to provide additional teachings on the process disclosed herein, two examples are provided below.

EXAMPLE 1

Figure 2B:
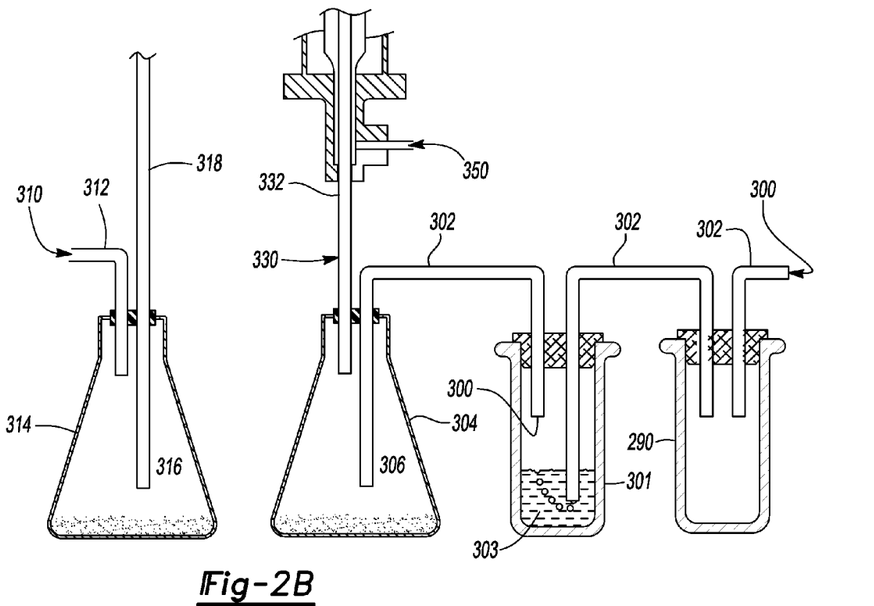
FIG. 2B is a schematic representation of an apparatus used to make structured particles using a precursor vapor of a liquid.
Figure 2C:
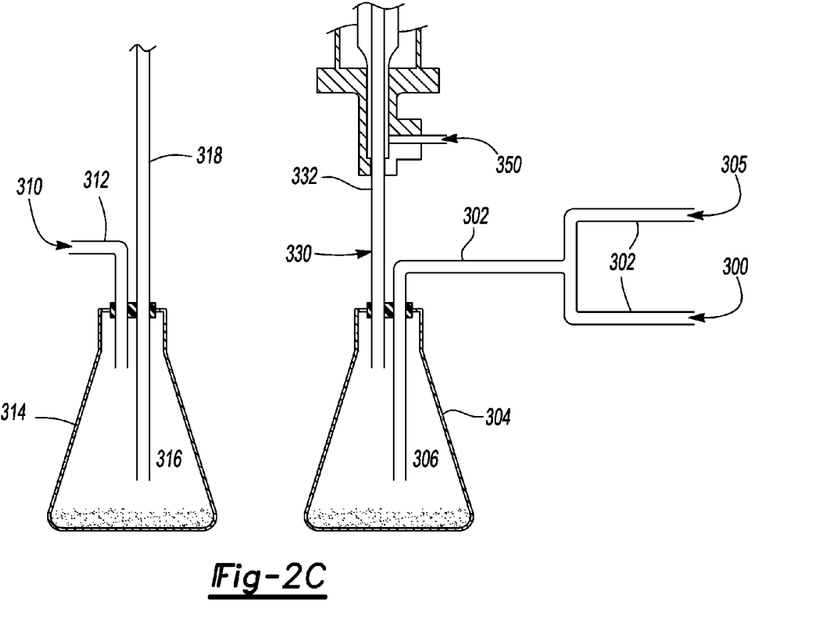
FIG. 2C is a schematic representation of an apparatus used to make structured particles using a precursor gas.

Core-shell nanoparticles having a core of lithium-titanium oxide ($Li_4Ti_5O_{12}$) and a shell of carbon were produced using an apparatus as illustrated in FIG. 2 and the process described above. In particular, a first precursor of anthracene and/or ethylene was provided and passed through the plasma torch using a first gas of argon with a flow rate of 1.47 standard liters per minute (SLPM). In addition, a plasma gas of argon with a flow rate of 2.89 SLPM was also provided. For a second precursor, particles of $Li_4Ti_5O_{12}$ having a mean diameter of less than 38 microns were provided to a location between the high field zone and the afterglow region of the plasma apparatus using a second gas of argon with a flow rate of 1.83 SLPM. A microwave energy source of 900 watts and an overall pressure of +10 torr were used to generate the plasma within the plasma torch, and in some instances, one or both of the beakers containing the anthracene and/or ethylene and the $Li_4Ti_5O_{12}$ were subjected to ultrasonic vibration during the plasma process.

Figures 4, 5:
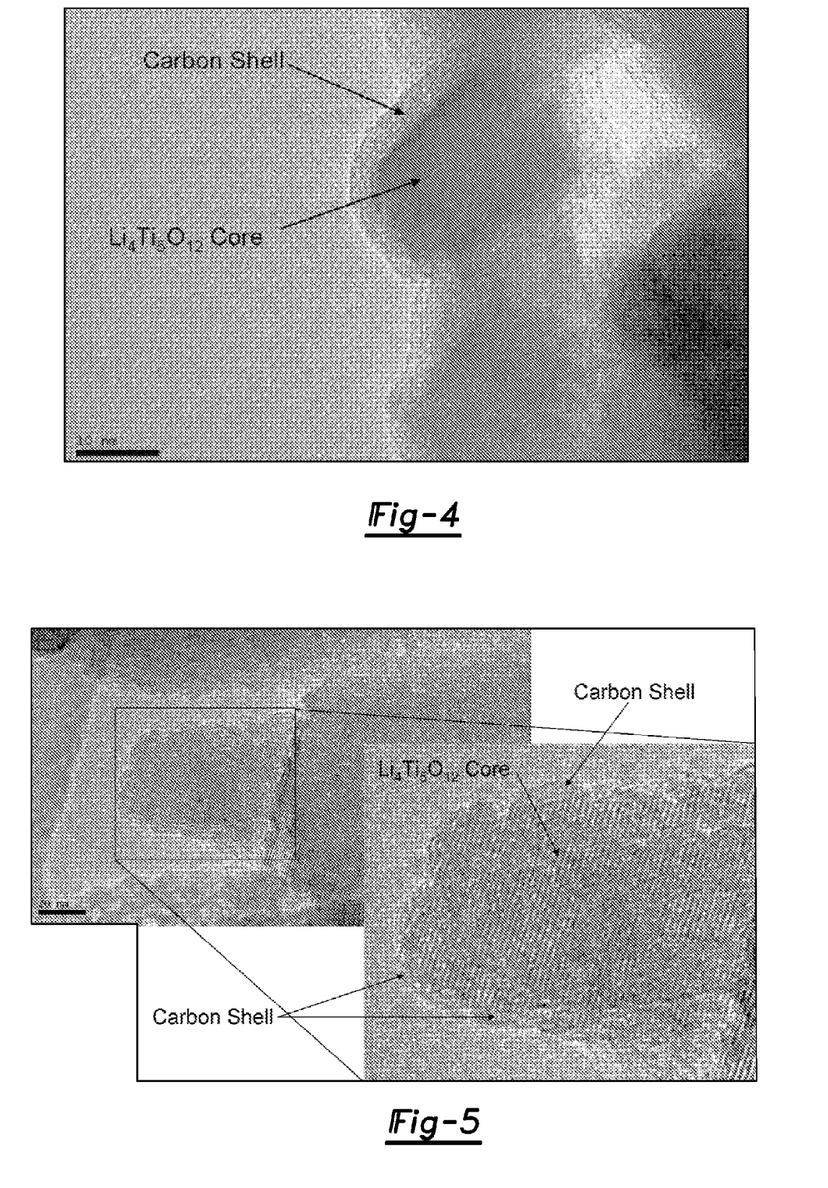
FIG. 4 is a transmission electron microscopy (TEM) image of a $Li_4Ti_5O_{12}$/carbon core-shell nanoparticle.
FIG. 5 is a high resolution transmission electron microscopy (HR-TEM) image of $Li_4Ti_5O_{12}$ coated with carbon.

As discussed above, it is postulated that the anthracene and/or ethylene was at least partially decomposed and allowed to condense on the particles of the $Li_4Ti_5O_{12}$. A transmission electron microscopy (TEM) image of a $Li_4Ti_5O_{12}$/carbon core-shell nanoparticle is shown in FIG. 4 and a high resolution transmission electron microscopy (HR-TEM) image illustrating that the carbon shell is continuous about the $Li_4Ti_5O_{12}$ core is shown in FIG. 5.

EXAMPLE 2

Figure 6:
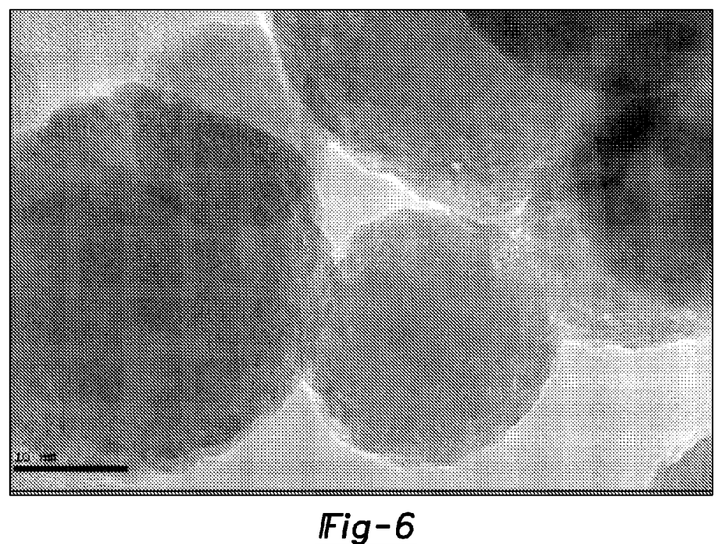
FIG. 6 is a TEM image of $SnO_2$/carbon core-shell nanoparticles.
Figure 7:
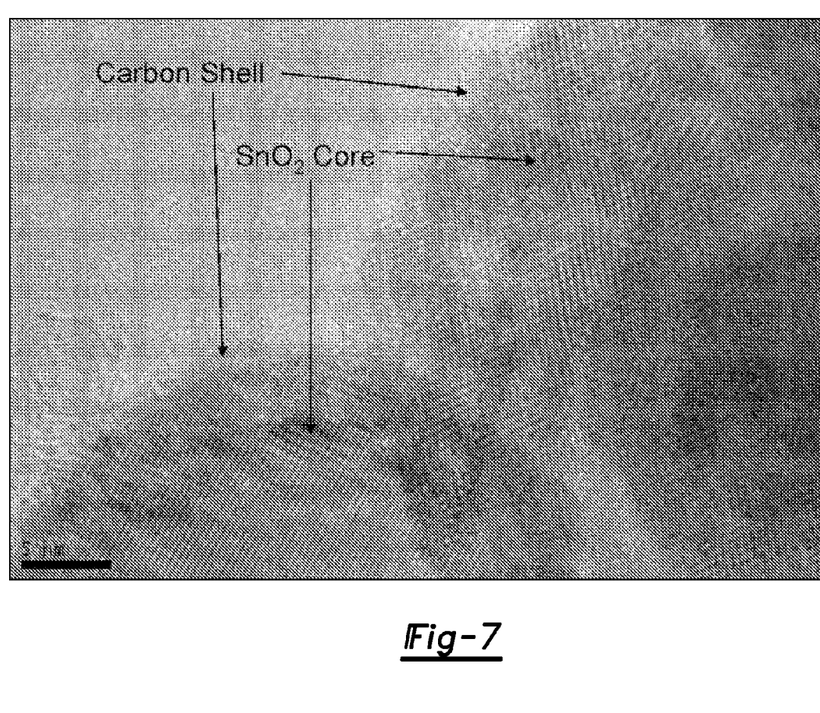
FIG. 7 is a HR-TEM image of $SnO_2$/carbon core-shell nanoparticles.

A plurality of tin-oxide ($SnO_2$)/carbon core-shell nanoparticles were produced using an apparatus as illustrated in FIG. 2. In particular, a first precursor of anthracene was provided to the high field zone of the plasma using a first gas of argon with a flow rate of 1.47 SLPM. In addition, a plasma gas of argon was provided using a flow rate of 2.89 SLPM. A second precursor of $SnO_2$ was provided at the bottom edge of the afterglow/top of the high field zone region using a second gas of argon with a flow rate of 1.83 SLPM. A microwave energy source of 900 watts and an overall pressure of +10 torr were used to generate the plasma within the plasma torch, and in some instances, one or both of the beakers with the anthracene and the $SnO_2$ were subjected to ultrasonic vibration during the plasma process. A TEM image of $SnO_2$/carbon core-shell nanoparticles is shown in FIG. 6 and a HR-TEM image illustrating the outer carbon shell on the inner $SnO_2$ core is shown in FIG. 7.

The present invention is not bound by or to specific flow stream rates, compositions or configurations. In addition, even though the above examples disclose a method having a dual gas flow system with each gas flow having a different overall composition and only joining and mixing at the plasma high field zone, other gases, gas flow rates and/or plasma systems are included within the scope of the present invention. For example and for illustrative purposes only, a process using a direct current (DC) discharge plasma having a one flow gas system wherein a first gas and a plasma gas are one in the same is within the scope of the disclosed inventive method. This method would result in all of the gas that flows through the plasma and the first precursor being well-mixed before reaching the high field zone, as opposed to the two gas flow system wherein the first gas and the plasma gas mix with each other in the center of the high field zone as described in the examples above. In addition, an intermittent plasma provided by a pulsed power source and having an intermittent high field zone is included within the scope of the present invention. As such, the term high field zone includes intermittent high field zones and/or plasma generation zones.

The foregoing drawings, discussion and description are illustrative of specific embodiments of the present invention, but they are not meant to be limitations upon the practice thereof. Numerous modifications and variations of the invention will be readily apparent to those of skill in the art in view of the teaching presented herein. It is the following claims, including all equivalents, which define the scope of the invention.

We claim:

1. A process for making a composite material containing structured particles, the process including:

providing a first precursor in the form of a dry precursor carbon powder;
providing a first gas;
providing a microwave source of at least 900 watts;
generating a plasma using the microwave source, the plasma having a high field zone and an afterglow region, the afterglow region being downstream of the high field zone;
passing the first gas and the first precursor through the high field zone of the plasma;
decomposing at least part of the first precursor in the high field zone of the plasma;
providing a second precursor containing a second material, the second precursor being a dry precursor nanoparticle powder;
suspending the dry precursor nanoparticle powder in a second gas to produce an aerosol;
passing the aerosol with the dry precursor nanoparticle powder into the afterglow region, whereby the high field zone is bypassed by the aerosol and the dry precursor nanoparticle powder;
removing the first precursor that has been decomposed from the high field zone of the plasma; and
allowing at least part of the first precursor that has been decomposed to condense onto the dry precursor nanoparticle powder in the afterglow region in the aerosol to produce structured nanoparticles having an outer average mean diameter of less than 200 nanometers, the structured nanoparticles being frozen into their final configuration in the afterglow region.

2. The process of claim 1, wherein the first precursor contains a plurality of materials.

3. The process of claim 1, further including suspending the first precursor in the first gas to produce a first aerosol, the first aerosol passing through the high field zone of the plasma.

4. The process of claim 1, wherein decomposing at least part of the first precursor is vaporizing at least part of the first material.

5. The process of claim 1, wherein the structured nanoparticles are core-shell structured nanoparticles.

6. The process of claim 1, wherein the structured nanoparticles have a core made from the second material partially coated by the first precursor.

7. The process of claim 1, wherein the second material is in the form of a plurality of nanoparticles.

8. The process of claim 1, wherein the second material is a lithium compound.

9. The process of claim 1, wherein the second material is a lithium alloying material.

10. The process of claim 1, further including using the structured nanoparticles as the second material within the second precursor and allowing the first precursor that has been decomposed to condense onto the nanoparticles in the second aerosol to produce further structured particles.

11. The process of claim 1, further including using the structured nanoparticles as the second material within the second precursor and allowing a third material that is part of the first precursor and has been decomposed in the high field zone of the plasma to condense onto the structured nanoparticles in the aerosol to produce further structured particles.

12. The process of claim 11, further including using the further structured particles as the second material within the second precursor and allowing a fourth material that is part of the first precursor and has been decomposed in the high field zone of the plasma to condense onto the further structured particles in the second aerosol to produce still further structured particles.

13. The process of claim 1, wherein the first aerosol passes through a tube that terminates within the high field zone of the plasma.

14. The process of claim 11, further including supplying a plasma gas that passes through the high field zone of the plasma.

15. The process of claim 1, wherein the plasma is a non-oxidizing plasma.

16. The process of claim 1, wherein the plasma is a low power atmospheric or near atmospheric pressure plasma with energy focused within a coupler.

* * * * *